(12) United States Patent
Grötsch et al.

(10) Patent No.: US 8,129,737 B2
(45) Date of Patent: Mar. 6, 2012

(54) OPTOELECTRONIC COMPONENT

(75) Inventors: Stefan Grötsch, Bad Abbach (DE); Norbert Linder, Lappersdorf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 12/442,589

(22) PCT Filed: Sep. 17, 2007

(86) PCT No.: PCT/DE2007/001679
§ 371 (c)(1), (2), (4) Date: Jul. 7, 2010

(87) PCT Pub. No.: WO2008/040298
PCT Pub. Date: Apr. 10, 2008

(65) Prior Publication Data
US 2010/0270569 A1 Oct. 28, 2010

(30) Foreign Application Priority Data
Sep. 29, 2006 (DE) .......................... 10 2006 046 277

(51) Int. Cl.
*H01L 33/00* (2010.01)
(52) U.S. Cl. .............................. 257/98; 257/99; 257/100
(58) Field of Classification Search .................... 257/98, 257/99, 100
See application file for complete search history.

(56) References Cited

U.S. PATENT DOCUMENTS

| | | | |
|---|---|---|---|
| 7,102,158 B2 * | 9/2006 | Tysoe et al. | 257/48 |
| 2004/0150997 A1 | 8/2004 | Ouderkirk et al. | |
| 2004/0218390 A1 | 11/2004 | Holman et al. | |
| 2006/0091412 A1 | 5/2006 | Wheatley et al. | |
| 2006/0164838 A1 | 7/2006 | Park et al. | |

FOREIGN PATENT DOCUMENTS

| | | |
|---|---|---|
| EP | 1 657 758 | 5/2006 |
| WO | WO 2006/035388 | 4/2006 |

OTHER PUBLICATIONS

The International Search Report for International Application No. PCT/DE2007/001679 dated Feb. 22, 2008.
I. Schnitzer et al., "30% external quantum efficiency from surface textured, thin-film light-emitting diodes", *Appl. Phys. Lett.*, vol. 63, No. 16, pp. 2174-2176 (Oct. 18, 1993).

* cited by examiner

*Primary Examiner* — Tan N Tran
(74) *Attorney, Agent, or Firm* — Fish & Richardson P.C.

(57) ABSTRACT

Described is an optoelectronic component with at least one semiconductor body having an active region for generating electromagnetic radiation, and with a housing comprising a filter element that is disposed after the active region in the emission direction, in which the filter element selectively transmits a primary radiation fraction having a predetermined primary radiation property.

26 Claims, 3 Drawing Sheets

OPTOELECTRONIC COMPONENT

CROSS REFERENCE TO RELATED APPLICATION

This application is the National Stage International Application No. PCT/DE2007/001679, filed on Sep. 17, 2007, which claims priority to German Patent Application Serial No. 10 2006 046 277.7, filed on Sep. 29, 2006. The contents of these applications are hereby incorporated by reference in their entireties.

BACKGROUND

The present invention is directed to an optoelectronic component with at least one semiconductor body having an active region for generating electromagnetic radiation. Such a component can be implemented, for example, as a light-emitting diode (LED). Conventional light-emitting diodes ordinarily emit incoherent, unpolarized radiation.

It is an object of the present invention to select the radiation emitted by a component of the aforesaid kind, for example an LED, for a predetermined radiation property. In particular, the highest possible proportion of radiation having the predetermined property is to be generated.

SUMMARY

Provided according to the invention is an optoelectronic component with at least one semiconductor body that includes an active region for generating electromagnetic radiation, said component having a housing that comprises, disposed after the active region, a filter element that selectively transmits a primary radiation fraction having a predetermined primary radiation property.

The primary radiation property can, for example, relate to the polarization, the wavelength or/and the direction of the primary radiation fraction.

In an advantageous configuration of the optoelectronic component, the filter element also reflects a secondary radiation fraction having a secondary radiation property different from the primary radiation property. This reflection of the secondary radiation fraction is preferably effected such that the secondary radiation fraction is reflected back into the semiconductor body and there undergoes a deflection process and/or an absorption and re-emission process, and the deflected or re-emitted radiation impinges on the filter element again. The aforesaid processes advantageously increase the radiation fraction having the predetermined primary radiation property, and thus the overall magnitude of the primary radiation fraction transmitted by the filter element.

The primary radiation property is preferably complementary to the secondary radiation property. This means that the primary radiation property and the secondary radiation property relate to the same physical property, such as polarization, and cancel each other out, as is the case, for example, with mutually orthogonal polarization directions in linearly polarized radiation.

The filter element associated with the optoelectronic component can be configured as a dichroic filter. When such a dichroic filter is used, the primary radiation fraction, whose wavelength is in a predetermined wavelength range, is transmitted, whereas the secondary radiation fraction, which has a wavelength outside the predetermined wavelength range, is absorbed or preferably reflected.

In another variant of the optoelectronic component, the filter element is implemented as a polarization filter, such that the primary radiation fraction, having a predetermined polarization property, is transmitted, and the secondary radiation fraction, having a polarization that deviates therefrom, such as a complementary polarization, is absorbed or preferably reflected.

In another variant of the optoelectronic component, the filter element is implemented as a directional filter, such that the primary radiation fraction, having a predetermined emission direction, is transmitted by the filter element, and the secondary radiation fraction, having a direction of propagation that deviates from said predetermined emission direction, is absorbed or reflected by the filter element.

Taking this further, the variants of the filter that have been cited by way of example can also be combined in the optoelectronic component. For instance, a directional filter can be combined with a polarization filter to give the primary radiation fraction a predetermined direction of propagation and a predetermined polarization.

In all of the above-cited filter variants, the secondary radiation fraction is preferably reflected back into the radiation-emitting semiconductor body and there undergoes a deflection process or an absorption and re-emission process, such that the overall magnitude of the outcoupled primary radiation fraction can advantageously be increased.

In the case of the variant embodiment of the filter element as a directionally selective filter, the filter element can possess structure elements that cause the emitted radiation to be filtered with respect to emission direction. These structure elements can be configured, for example, as cone-like, pyramid-like or prism-like, and can further be arranged in the form of a two-dimensional grid.

In the optoelectronic component, the radiation-emitting semiconductor body is preferably implemented as a thin-film semiconductor body.

A thin-film semiconductor body is distinguished in particular by at least one of the following characteristic features:
  applied to or formed on a first main surface of a radiation-generating epitaxial layer sequence, which surface faces a carrier element, is a reflective layer that reflects at least some of the electromagnetic radiation generated in the epitaxial layer sequence back into the latter;
  the epitaxial layer sequence has a thickness in the range of 20 μm or less, particularly preferably in the range of 10 μm or less; and
  the epitaxial layer sequence preferably includes at least one semiconductor layer with at least one surface having an intermixing structure that in the ideal case brings about a nearly ergodic distribution of the light in the epitaxial layer sequence, i.e., said layer has a stochastic scattering behavior that is as ergodic as possible.

A basic principle of a thin-film LED chip is described, for example, in I. Schnitzer et al., *Appl. Phys. Lett.* 63 (16), Oct. 18, 1993, pages 2174-2176, whose disclosure content in this regard is hereby incorporated by reference.

A thin-film LED chip is, as a good approximation, a Lambertian surface radiator, and is therefore particularly suitable for floodlighting and projection applications.

In the optoelectronic component, a reflective layer is preferably disposed on a side of the active layer sequence that faces the filter element. The reflective layer can, for example, contain a metallic material and/or a transparent, conductive oxide, such as a metal oxide. The reflective layer is preferably disposed outside the semiconductor body.

The semiconductor body is preferably attached to a carrier element. In the case of the above-cited reflective layer, the latter is positioned between the semiconductor body and the carrier element.

The semiconductor body, preferably the active region, can contain a phosphide-based compound semiconductor material. The compound semiconductor material particularly has the composition $Al_nGa_mIn_{1-n-m}P$, where $0 \leq n \leq 1$, $0 \leq m \leq 1$ and $n+m \leq 1$.

Alternatively, the semiconductor body, preferably the active region, can contain an arsenide-based compound semiconductor material. The compound semiconductor material particularly has the composition $Al_nGa_mIn_{1-n-m}As$, where $0 \leq n \leq 1$, $0 \leq m \leq 1$ and $n+m \leq 1$.

A further possibility is for the semiconductor body, preferably the active region, to contain a nitride-based compound semiconductor material. The compound semiconductor material particularly has the composition $Al_nGa_mIn_{1-n-m}N$, where $0 \leq n \leq 1$, $0 \leq m \leq 1$ and $n+m \leq 1$.

Alternatively, the semiconductor body can contain a zinc-oxide-based semiconductor material; particularly preferably, the semiconductor body contains MgZnCdO.

The filter element preferably contains a glass material.

Alternatively, the filter element can contain sapphire, transparent crystals or quartz.

A further possibility is for the filter element to contain transparent ceramics, for example $Al_2O_3$.

Alternatively, the filter element can contain SiC or diamond.

In a preferred embodiment of the optoelectronic component, the filter element is spaced apart from the semiconductor body. The distance between the filter element and the semiconductor body is preferably less than 0.5 mm, particularly preferably less than 0.1 mm. The distance between the filter element and the semiconductor body is advantageously greater than 0 μm and less than or equal to 10 μm.

In a further embodiment of the optoelectronic component, disposed between the semiconductor body and the filter element is a conversion element that converts the radiation emitted by the semiconductor body into radiation of another wavelength. Mixed-color light, particularly white light, can be generated in this fashion. A color shift in the radiation generated by the semiconductor body, for example from ultraviolet light to green light, is also possible.

The spectrum, the directional distribution or/and the polarization of the radiation emitted by the optoelectronic component and transmitted as a useful radiation fraction can be modified in a predetermined manner, depending on the type of filter element and its configuration.

Further features, preferences and utilities of the optoelectronic component will become apparent from the seven exemplary embodiments described hereinafter in conjunction with FIGS. 1 to 7.

Figure 1:
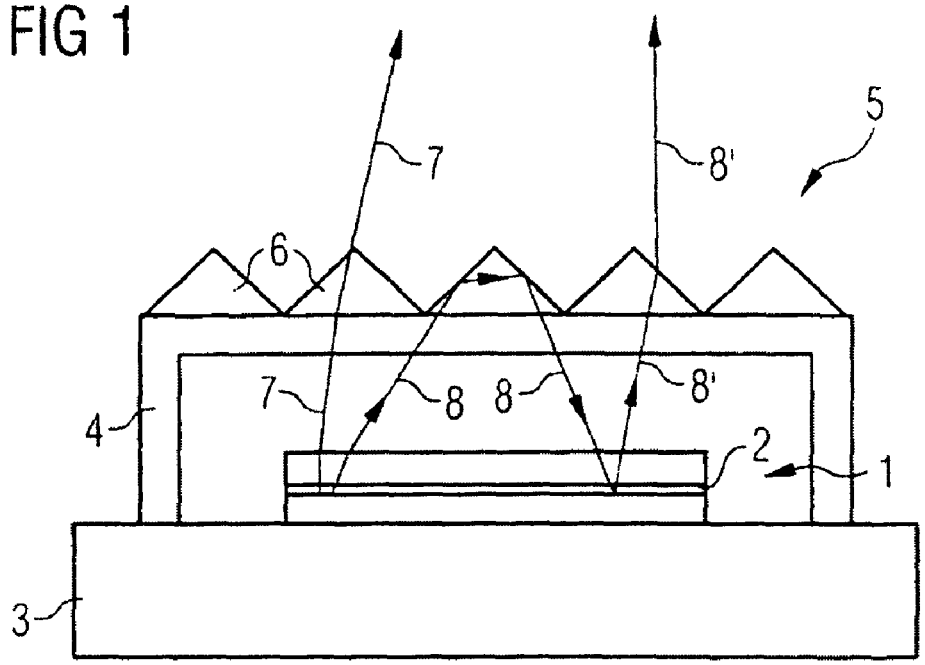
FIG. 1 is a schematic sectional representation of a first exemplary embodiment of an optoelectronic component according to the invention.

In the figures, like or like-acting elements are provided with the same respective reference characters.

DETAILED DESCRIPTION

The exemplary embodiment of an optoelectronic component illustrated in FIG. 1 comprises a semiconductor body 1, which has an active region 2 for generating electromagnetic radiation and is mounted on a carrier element 3. Carrier element 3, together with a cap-like housing cover 4, forms the housing of the optoelectronic component.

The housing cover 4 is configured on the emission side as a filter element 5. In the exemplary embodiment according to FIG. 1, this filter element forms a directionally selective filter. To this end, filter element 5 comprises a plurality of structure elements 6, which are implemented in the present case as pyramid-shaped and which can further be arranged in a grid-like manner in the lateral direction.

The filter element is so constituted that a primary radiation fraction 7 having a predetermined emission direction is transmitted, whereas a secondary radiation fraction 8 having an emission direction that deviates from the predetermined emission direction is reflected back toward the semiconductor body 1 by the structure elements 6.

In the semiconductor body 1, this reflected-back secondary radiation fraction 8 undergoes an absorption and subsequent re-emission process in the active region. Since the re-emission process takes place approximately isotropically, or at least has no pronounced preferential direction, there is a certain probability that the radiation fraction 8' re-emitted in this way will have the predetermined radiation characteristic and will subsequently be transmitted by the filter element 5. Failing that, this radiation fraction can again be reflected back toward the semiconductor body to undergo another absorption and re-emission process or deflection process.

Figure 2:
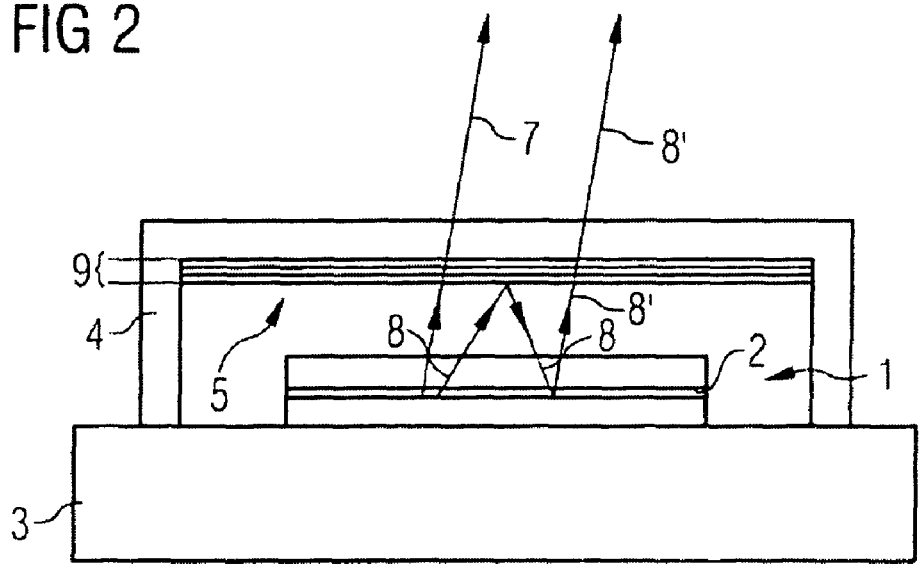
FIG. 2 is a schematic sectional view of a second exemplary embodiment of an optoelectronic component according to the invention.

The exemplary embodiment of an optoelectronic component illustrated in FIG. 2 is substantially similar to the exemplary embodiment of FIG. 1 with respect to semiconductor body 1, radiation-emitting region 2, carrier element 3 and housing cover 4.

In contradistinction thereto, the filter element 5 is implemented as a dielectric angle filter. A dielectric layer stack 9 thus serves to select a primary radiation fraction 7 having a predetermined emission direction. Secondary radiation fractions 8 with an emission direction that deviates from this are reflected back toward the semiconductor body and potentially re-emitted.

Figure 3:
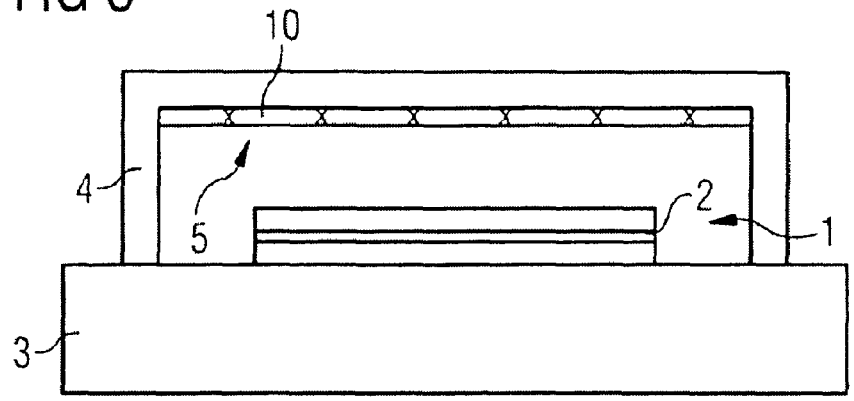
FIG. 3 is a schematic sectional view of a third exemplary embodiment of an optoelectronic component according to the invention.

FIG. 3 shows another exemplary embodiment of an optoelectronic component. This exemplary embodiment is substantially similar to the respective exemplary embodiments illustrated in FIGS. 1 and 2 with respect to semiconductor body 1, radiation-emitting region 2, carrier element 3, housing 4, and the beam path.

In contradistinction to the exemplary embodiments illustrated in FIGS. 1 and 2, the filter element 5 is implemented as a polarization filter that transmits a primary radiation fraction having a predetermined polarization, while a secondary radiation fraction having a polarization that deviates therefrom is reflected and may subsequently be re-emitted by the semiconductor body.

The polarization filter can be disposed as a filter layer 10 on the inner or outer face (not shown) of the housing cover 4. The filter element can further be implemented as a wire-grid polarizer.

Figure 4:
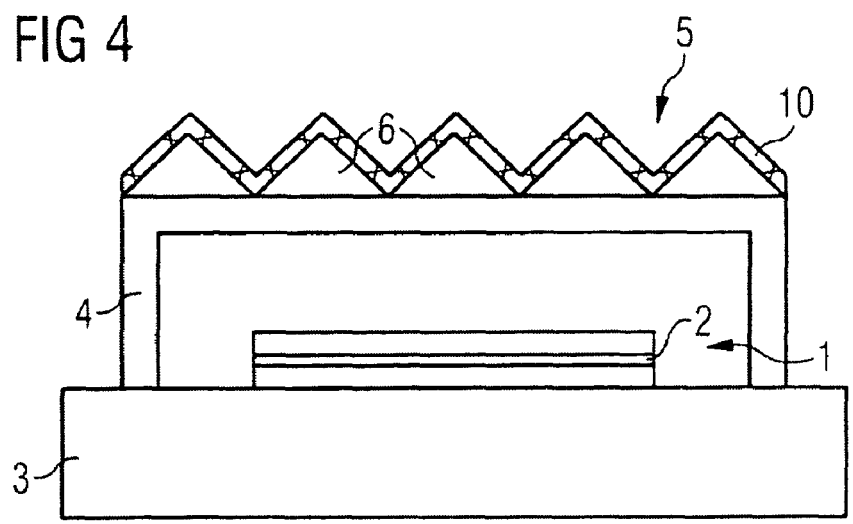
FIG. 4 is a schematic sectional representation of a fourth exemplary embodiment of an optoelectronic component according to the invention.

The exemplary embodiment of an optoelectronic component illustrated in FIG. 4 is substantially similar to the exemplary embodiment illustrated in FIG. 1 with respect to semiconductor body 1, radiation-emitting region 2, carrier element 3, housing cover 4, the directionally selective filter comprising structure elements 6, and the beam path.

In addition, on the emission side, a polarization filter 10 is disposed on the structure elements, causing both the emission direction and the polarization of the transmitted primary radiation fraction to be selected in this exemplary embodiment. The polarization filter can be implemented as a wire-grid polarizer, for example.

Figure 5:
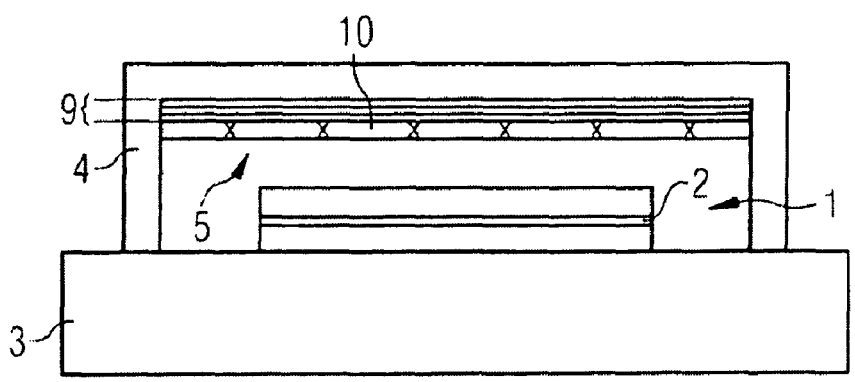
FIG. 5 is a schematic sectional representation of a fifth exemplary embodiment of an optoelectronic component according to the invention.

The exemplary embodiment of an optoelectronic component illustrated in FIG. 5 is substantially similar to the exemplary embodiment illustrated in FIG. 2 with respect to semiconductor body 1, radiation-emitting region 2, carrier element 3, housing cover 4, the dielectric angle filter comprising a dielectric layer stack 9, and the beam path. In addition to the angle filter 9, filter element 5 comprises a polarization filter 10, such as a wire-grid polarizer. The polarization and the radiation characteristic of the transmitted primary radiation fraction can thus be selected in this case.

Figure 6:
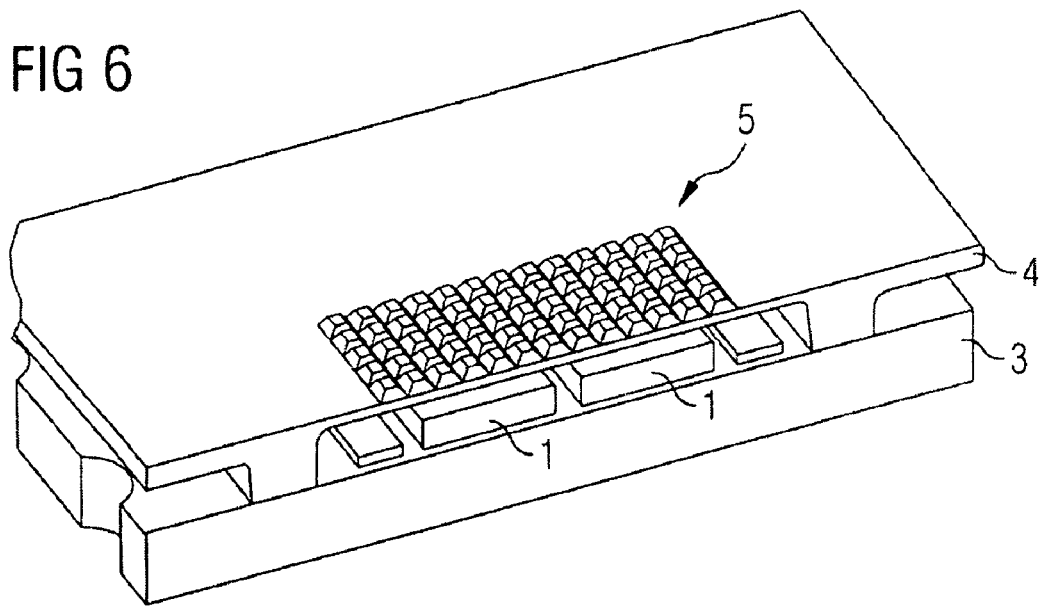
FIG. 6 is a schematic perspective view of a sixth exemplary embodiment of an optoelectronic component according to the invention.

FIG. 6 is a perspective detail view of another exemplary embodiment.

A plurality of semiconductor bodies 1, preferably in the form of thin-film semiconductor bodies, are disposed on a common carrier element 3, for instance a ceramic substrate. The thin-film semiconductor bodies are implemented as substrateless, that is, they have no epitaxial growth substrate. A respective reflective layer is further formed between each active region and the carrier element 3, preferably between each semiconductor body 1 and the carrier element 3.

The semiconductor body 1 is spanned on its upper face by a cap-shaped housing cover 4. Integrated into the housing cover 4 is a filter element 5 that can be implemented, as illustrated, as a directionally selective filter having a plurality of structure elements. The structure elements are shaped like truncated pyramids and are arranged in a grid-like manner in the lateral direction.

Figure 7:
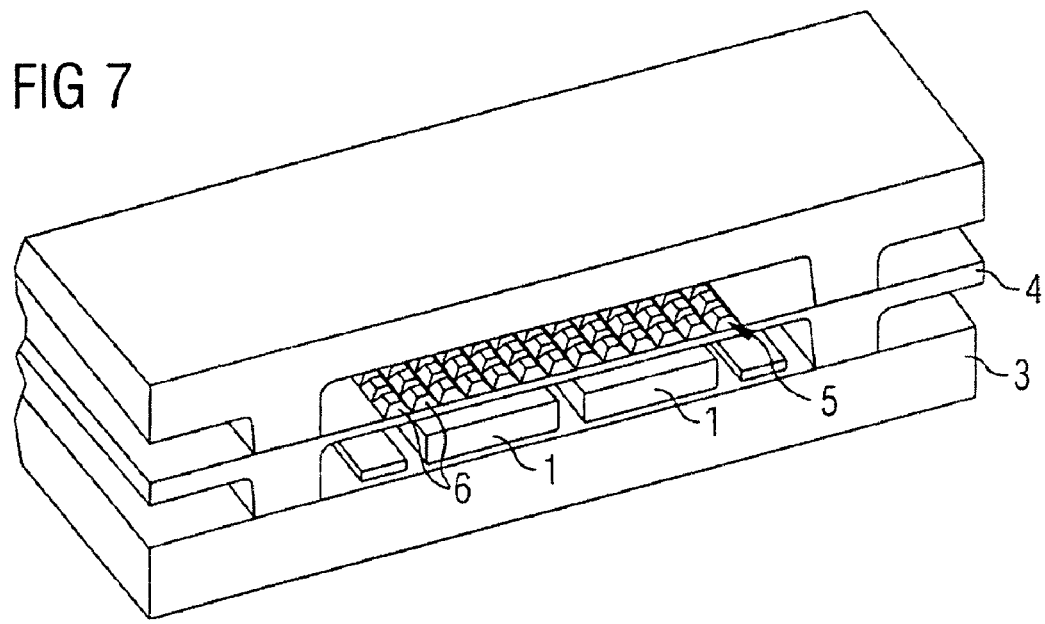
FIG. 7 is a schematic perspective detail view of a seventh exemplary embodiment of an optoelectronic component according to the invention.

FIG. 7 is a perspective detail view of another exemplary embodiment.

In a similar manner as in FIG. 6, a plurality of semiconductor bodies 1, preferably in the form of thin-film semiconductor bodies, are disposed on a common carrier element 3, such as a ceramic substrate. A respective reflective layer is further formed between each active region and the carrier element 3, preferably between each semiconductor body 1 and the carrier element 3.

The semiconductor body 1 is spanned on its upper face by a first cap-shaped housing cover 4. Integrated into the housing cover 4 is a filter element 5 that can be implemented, as illustrated, as a directionally selective filter comprising a plurality of structure elements. The structure elements are shaped like truncated pyramids and are arranged in a grid-like manner in the lateral direction.

A second housing cover 11 is disposed after the first housing cover 4 in the emission direction. This second housing cover can be optically inactive, merely having a protective effect against environmental influences. The second housing cover can further be provided with an additional filter element (not shown), such as a polarization filter.

According to the invention, the filter element can equally well be integrated into the housing, for instance the housing cover, or placed on the housing as a separate element. In the latter case, the filter element is preferably implemented as a filter film. BEFs (brightness enhancement films) or DBEFs (dual brightness enhancement films) provided with a prism structure or with reflection polarizers can be used for this purpose. Such films are also known as Vikuiti films (manufactured by 3M).

The invention is not limited by the description made with reference to the exemplary embodiments. Rather, the invention encompasses any novel feature and any combination of features, including in particular any combination of features recited in the claims, even if that feature or combination itself is not explicitly mentioned in the claims or exemplary embodiments.

The invention claimed is:

1. An optoelectronic component with at least one semiconductor body having an active region for generating electromagnetic radiation, and with a housing comprising,
    disposed after said active region in the emission direction, a filter element that selectively transmits a primary radiation fraction having a predetermined primary radiation property,
    wherein a secondary radiation fraction having a secondary radiation property different from said primary radiation property is reflected by said filter element,
    said filter element reflects said secondary radiation fraction toward said semiconductor body,
    said secondary radiation fraction undergoes a deflection process or an absorption and re-emission process in said semiconductor body, and
    the deflected or re-emitted radiation impinges on said filter element.

2. The optoelectronic component as in claim 1, wherein said primary radiation property is the direction, the polarization or/and the wavelength of said primary radiation fraction.

3. The optoelectronic component as in claim 1, wherein both said primary radiation property and said secondary radiation property are the direction, the polarization or/and the wavelength of said radiation fraction.

4. The optoelectronic component as in claim 1, wherein said primary radiation property is complementary to said secondary radiation property.

5. The optoelectronic component as in claim 1, wherein said filter element is a dichroic filter.

6. The optoelectronic component as in claim 1, wherein said filter element is a polarization filter.

7. The optoelectronic component as in claim 1, wherein said filter element is a directional filter.

8. The optoelectronic component as in claim 7, wherein said filter element comprises a plurality of structure elements.

9. The optoelectronic component as in claim 8, wherein said structure elements are configured as cone-like, a pyramid-like, truncated-pyramid-like or prism-like.

10. The optoelectronic component as in claim 8, wherein said structure elements are arranged in the manner of a two-dimensional grid.

11. The optoelectronic component as in claim 7, wherein said filter element comprises a dielectric layer stack.

12. The optoelectronic component as in claim 1, wherein said filter element contains a glass material.

13. The optoelectronic component as in claim 1, wherein said filter element is implemented as disposed in or against said housing.

14. The optoelectronic component as in claim 13, wherein said filter element is implemented as a cover of said housing.
15. The optoelectronic component as in claim 1, wherein said filter element is spaced apart from said semiconductor body.
16. The optoelectronic component as in claim 15, wherein the distance between said filter element and said semiconductor body is greater than 0 µm and less than or equal to 10 µm.
17. The optoelectronic component as in claim 1, wherein a reflective layer is disposed on a side of said active region that faces said filter element.
18. The optoelectronic component as in claim 17, wherein said reflective layer contains a metal.
19. The optoelectronic component as in claim 17, wherein said reflective layer is implemented as a metallic layer.
20. The optoelectronic component as in claim 1, wherein said semiconductor body is disposed on a carrier element.
21. The optoelectronic component as in claim 1, wherein disposed between said active region and said filter element is a conversion element that converts the radiation generated by said active region into radiation of another wavelength.
22. The optoelectronic component as in claim 1, wherein said semiconductor body is implemented as a thin-film semiconductor body.
23. The optoelectronic component as in claim 1, wherein said component comprises a plurality of semiconductor bodies, each of which has an active region for generating electromagnetic radiation.
24. The optoelectronic component as in claim 23, wherein said semiconductor bodies are disposed on a common carrier element.
25. The optoelectronic component as in claim 1, wherein said component is an LED.
26. The optoelectronic component as in claim 1, wherein said component emits incoherent radiation.

* * * * *